(12) United States Patent
Wennrich

(10) Patent No.: US 7,869,764 B2
(45) Date of Patent: Jan. 11, 2011

(54) ELECTRONIC CIRCUIT FOR A HIGH-FREQUENCY SWITCH

(75) Inventor: Andreas Wennrich, Limburg (DE)

(73) Assignee: Feig Electronic GmbH, Weilburg-Waldhausen (DE)

( * ) Notice: Subject to any disclaimer, the term of this patent is extended or adjusted under 35 U.S.C. 154(b) by 553 days.

(21) Appl. No.: 12/024,569

(22) Filed: Feb. 1, 2008

(65) Prior Publication Data
US 2008/0186745 A1    Aug. 7, 2008

(30) Foreign Application Priority Data

| Feb. 2, 2007 | (DE) | ..................... 100 2007 006 100 |
| Jul. 6, 2007 | (EP) | ..................... 07111897 |
| Dec. 20, 2007 | (EP) | ..................... 07123765 |
| Jan. 23, 2008 | (EP) | ..................... 08100837 |

(51) Int. Cl.
*H04B 7/00* (2006.01)
*H04B 1/18* (2006.01)

(52) U.S. Cl. ........... 455/41.2; 455/41.1; 455/83; 455/193.1; 340/10.4; 340/572.1

(58) Field of Classification Search ........... 455/41.2, 455/41.1, 83, 193.1, 282, 319–320, 78, 550.1, 455/562.1, 269–270, 195.1, 261–262, 281, 455/193.3; 340/572.1, 568.1, 10.51, 572.4, 340/572.3, 572.7, 10.4, 10.1; 235/441, 451, 235/492; 361/61, 126, 818
See application file for complete search history.

(56) References Cited

U.S. PATENT DOCUMENTS

| 4,637,065 A | 1/1987 | Ruppell |
| 4,979,232 A | 12/1990 | Martz |
| 7,068,237 B2 * | 6/2006 | Fukuda ..................... 343/815 |
| 7,268,742 B2 * | 9/2007 | Rahim ..................... 343/867 |
| 7,317,379 B2 * | 1/2008 | Kimura ..................... 340/10.51 |
| 7,546,092 B1 * | 6/2009 | Murdoch ..................... 455/82 |
| 7,557,708 B1 * | 7/2009 | Pacholok et al. ..................... 340/572.1 |
| 2006/0017634 A1 | 1/2006 | Meissner |
| 2006/0250246 A1 * | 11/2006 | Forster ..................... 340/572.1 |
| 2007/0175995 A1 * | 8/2007 | Maniwa et al. ..................... 235/451 |
| 2009/0117938 A1 * | 5/2009 | Georgantas et al. ..................... 455/552.1 |
| 2009/0243804 A1 * | 10/2009 | Fukuda ..................... 340/10.1 |
| 2009/0305628 A1 * | 12/2009 | Vavik ..................... 455/14 |

FOREIGN PATENT DOCUMENTS

| DE | 10056176 C1 | 10/2002 |
| DE | 103 05 361 | 8/2004 |
| DE | 10 2005 013123 | 10/2005 |
| EP | 1619750 | 1/2006 |

* cited by examiner

*Primary Examiner*—Pablo N Tran
(74) *Attorney, Agent, or Firm*—Smith Gambrell & Russell LLP

(57) ABSTRACT

An electronic circuit for a high-frequency switch for opening an antenna resonance circuit of an RFID system, wherein the high-frequency switch can be opened and closed by d.c. voltages, in which circuit a rectifier circuit generates the blocking voltage for opening the high-frequency switch from the high-frequency supply voltage, the rectifier circuit is designed such that it generates a blocking voltage whose value corresponds at least to the peak-to-peak value of the high-frequency voltage to be switched, the blocking voltage is conducted via the same electric connecting line via which the high-frequency supply voltage and a closing voltage are also conducted to the antenna of the RFID system, and a resistor is connected in parallel with each of the PIN diodes, which are series-connected with respect to direct current.

7 Claims, 4 Drawing Sheets

ELECTRONIC CIRCUIT FOR A HIGH-FREQUENCY SWITCH

CLAIM OF PRIORITY

This application claims priority from German Patent Application No. 10 2007 006 100.7 filed Feb. 2, 2007, European Patent Application No. 07 111897.0-2215 filed Jul. 6, 2007, European Patent Application No. 07 123765.5 filed Dec. 20, 2007, and European Patent Application No. 08 100837.7 filed Jan. 23, 2008, each of which are incorporated herein by reference.

DESCRIPTION

The invention relates to an electronic circuit for a high-frequency switch for opening an antenna resonance circuit of an RFID system.

The invention relates to a high-frequency switch operating at 1 megahertz (MHz) and higher and capable of switching powers such as 15 watts (W) at voltages of 500 volts (V) and currents of 2 amperes (A).

These electrical magnitudes can occur, for example, at the antennas of an RFID system, in which the distance between the transponders and the antenna of the RFID system exceeds a distance of 0.5 meters.

The antenna of a prior art RFID system usually comprises at least one antenna loop, which represents an inductance, and a matching circuit, with which the antenna can be tuned as well as possible to the operating frequency of the RFID system, so as to achieve a high current and thus a high magnetic field strength.

Many prior art RFID systems are operated with a plurality of antennas, wherein the carrier frequency of 13.56 MHz, for example, is switched over from one antenna to another. This can be achieved by devices known as multiplexers. Such applications of RFID systems are described, for example, in DE 10056176 C1 and EP 1619750 A1. By virtue of electromagnetic fields, electromagnetic coupling to an extent that depends on the design, size and arrangement of the individual antennas the electromagnetic fields of the actually active antennas can couple into neighboring, inactive antennas more or less. Such coupling of active and inactive antennas causes a change of the resonance frequency of the antenna resonance circuit of the active antennas and results in power losses, meaning that the full power of the active antenna is no longer available for communication with transponders.

An effective way to prevent mutual coupling of antennas of an RFID system is achieved by using a switch to open the antenna loop and therefore the antenna resonance circuit of the inactive antennas. A high-frequency switch for opening inactive antennas is described in DE 102005013123 A1. In the circuit described therein, the voltage for opening the high-frequency switch, which is composed of PIN diodes, is generated from the voltage coupled into a neighboring antenna.

The technical problem underlying the invention is to provide an improved embodiment of a high-frequency switch and also an electronic circuit for a high-frequency switch, with which an antenna resonance circuit of an RFID system can be completely opened, thus representing an approximately completely open switch for the high-frequency voltage that is present due to coupling.

This technical problem is solved by the electronic circuit having the features of claim 1.

The inventive electronic circuit for a high-frequency switch for opening an antenna resonance circuit of an RFID system, wherein the high-frequency switch, which is composed of at least two PIN diodes, can be opened and closed by d.c. voltages, is characterized in that a rectifier circuit, which is disposed outside the antenna resonance circuit, generates the blocking voltage for opening the high-frequency switch from the high-frequency supply voltage, the tapping operation, which takes place via at least one connecting line, being decoupled with respect to direct current from the rectifier circuit, and the rectifier circuit is designed such that it generates a blocking voltage whose value corresponds at least to the peak-to-peak value of the high-frequency voltage to be switched, and the blocking voltage is conducted via the same electric connecting line via which the high-frequency supply voltage and a closing voltage are also conducted to the antenna of the RFID system, injection of the blocking voltage taking place with an high impedance, and resistors are connected in parallel with the respective PIN diodes, which are series-connected with respect to direct current.

The term peak-to-peak value defines the value sum of the maximum value of the positive alternation and the minimum value of the negative alternation of the high-frequency voltage to be switched.

Furthermore, the invention ensures that the voltages for control of the high-frequency switch and the high-frequency supply voltage are conducted via the same connecting line.

According to the invention, it is provided that a high-frequency switch comprising PIN diodes will be used for this purpose, and that the PIN diodes can be blocked by means of a negative d.c. voltage, referred to hereinafter as the blocking voltage. The value of the blocking voltage must be at least as large as the peak-to-peak value of the high-frequency voltage to be switched, the peak-to-peak value of the high-frequency voltage to be switched being determined by the high-frequency voltage that is present due to coupling and that can have a peak-to-peak value many times higher than that of the high-frequency supply voltage.

In order to reclose the high-frequency switch, there is needed a further d.c. voltage, referred to hereinafter as the closing voltage, which is a positive d.c. voltage relative to the blocking voltage but whose value can be very much smaller than the blocking voltage. The closing voltage can be generated, for example, by a write/read station, a multiplexer or an antenna matching circuit.

The inventive circuit ensures that a blocking voltage sufficiently high to block the PIN diodes of the high-frequency switch completely is generated, thus ensuring that the blocking voltage is conducted to the antenna via the same electrical connecting line via which the high-frequency supply voltage and the closing voltage are also conducted to the antenna.

For this purpose, the blocking voltage is generated from the high-frequency supply voltage by means of a rectifier circuit. Depending on the value of the needed blocking voltage, the rectifier circuit can also be designed as a voltage-doubling or voltage-multiplying circuit, such as a Villard circuit. The value of the needed blocking voltage can depend on numerous parameters, such as the coupling between an active antenna resonance circuit and the antenna resonance circuit to be opened, or the duration for which the PIN diode switch is to be open.

Such injection of the high-frequency supply voltage into the rectifier circuit takes place outside the antenna resonance circuit, since the high voltages such as occur at the high-frequency switch itself are not present there. In order not to load the closing voltage with the rectifier circuit, the injection of the high-frequency voltage is decoupled with respect to direct current, for example by means of a capacitor. Since the rectifier circuit represents a load for the high-frequency supply voltage, it is designed to have high impedance relative to the connected antenna.

To ensure that the blocking voltage is present at all PIN diodes, it is provided according to the invention that high-impedance resistors, via which the blocking voltage is divided over all PIN diodes, are connected in parallel with the respective PIN diodes.

According to the invention, the blocking voltage generated by the rectifier circuit is also injected outside the antenna resonance circuit into the high-frequency supply voltage. For this purpose it is advantageous to couple the blocking voltage with an high impedance, to ensure that the high-frequency supply voltage and the closing voltage are loaded as little as possible by the rectifier circuit.

In a further advantageous embodiment, to ensure that the high-frequency switch also remains securely in open condition for a long time period, the blocking voltage is buffered in a buffer capacitor having very high capacitance. The open high-frequency switch then represents a very high load impedance. The high capacitance in conjunction with the high load impedance of the high-frequency switch results in a long discharge time of the buffer capacitor. In common with the value of the blocking voltage, the necessary discharge time depends on several parameters, such as the coupling between a neighboring active antenna resonance circuit and the antenna resonance circuit to be opened, or the duration for which the high-frequency switch is to be open. If the closing voltage and the high-frequency supply voltage are activated, the buffer capacitor is charged. If the closing voltage and the high-frequency supply voltage are turned off, the buffer capacitor is slowly discharged and makes the blocking voltage available for the PIN diode switch.

In a further advantageous embodiment, there is specified a decoupling circuit that prevents situations in which high blocking voltage can impair or damage other components connected electrically to the inventive circuit, such as a read/write station or a multiplexer.

In the decoupling circuit, the high-frequency supply voltage is passed via a capacitor having very low impedance relative to the high frequency being used. An inductor having very high impedance relative to the high-frequency being used is connected in parallel with the capacitor. In series with the inductor there is provided a switch, which can be a transistor switch or an optocoupler, for example, and which is closed by applying the closing voltage. If the closing voltage is no longer present, the switch opens and thus has very high impedance relative to the blocking voltage, so that discharge of the blocking voltage via the decoupling circuit is effectively excluded.

According to the invention, the antenna resonance circuit is disconnected. In this way the antenna loop is also disconnected.

Further features and advantages of the invention will become evident from the associated drawing, in which several exemplary embodiments of an inventive circuit are illustrated merely by way of example. In the drawings:

FIG. 1 shows a basic structure of a circuit arrangement comprising a write/read station (16), a high-frequency switch (14), which is part of an resonance circuit (15) of an antenna of an RFID system, and a matching circuit (13) as well as a rectifier circuit (10) for generating the blocking voltage and a means (12) for generating the closing voltage.

Figure 1:
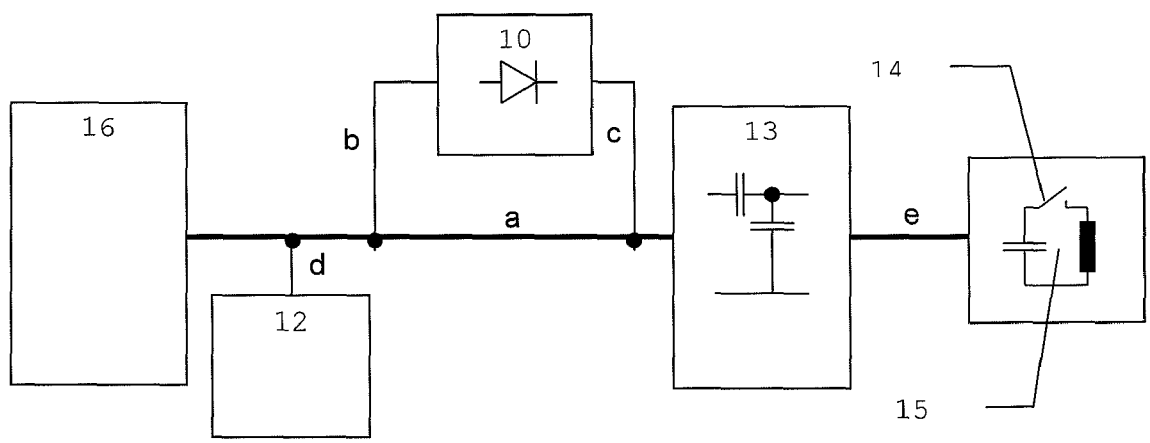
FIG. 1 shows a block diagram having the basic structure of high-frequency switch, blocking-voltage generator and control voltage.

In order to close resonance circuit (15) with high-frequency switch (14), the closing voltage is injected via a connecting line (d) into a high-frequency connecting line (a).

Injection of the high-frequency voltage into resonance circuit (15) takes place through write/read station (16). Via a connecting line (b), the voltage for supplying rectifier circuit (10) used for generating the blocking voltage is tapped from the high-frequency supply voltage. The high-frequency voltage injected into rectifier circuit (10) is adjusted there by a rectifier circuit to the value needed for blocking high-frequency switch (14). The blocking voltage is injected via a connecting line (c) and conducted via connecting lines (a) and (e) to high-frequency switch (14).

Control of whether high-frequency switch (14) is to be open or closed is achieved via the closing voltage, which is injected via means (12), which, for example, can also be part of write/read station (16). As soon as the closing voltage is turned off, high-frequency switch (14) is opened by the blocking voltage generated in rectifier circuit (10).

The inductor in antenna resonance circuit (15) is the antenna loop.

Figure 2:
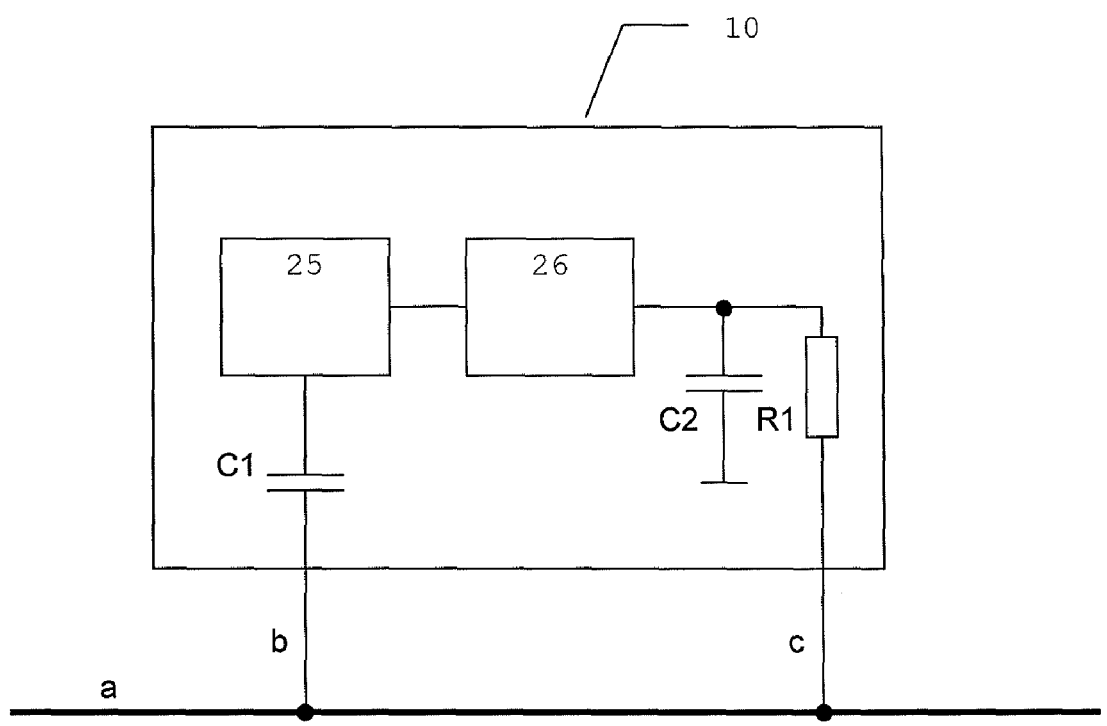
FIG. 2 shows a block diagram of the circuit for generating and injecting the blocking voltage.

FIG. 2 shows an embodiment of a rectifier circuit (10) for generating and injecting the blocking voltage, to which the high-frequency voltage is fed via a coupling capacitor (C1), which has very low impedance for the high-frequency voltage. A rectifier (26) is connected via a band-pass filter (25) to coupling capacitor (C1). Band-pass filter (25) prevents the high-frequency supply voltage from being modulated by harmonics, which can be caused by rectifier (26).

At the output of rectifier (26), which can be designed, for example, as a one-way rectifier or a Villard circuit depending on the needed value of the blocking voltage, the generated blocking voltage is buffered with a buffer capacitor (C2) having high capacitance. Together with buffer capacitor (26), a high-impedance load resistor (R1) at the output of rectifier (26) stabilizes the blocking voltage and, by virtue of its resistance value, which is high compared with the d.c. resistance of the closed high-frequency switch, prevents the closing voltage from being loaded too intensively by the output of rectifier circuit (10).

Resistor (R1) advantageously has values between 1 kiloohm (1 kΩ) and 10 kiloohm (10 kΩ). These values ensure that the blocking voltage can be injected sufficiently rapidly via connecting line (c) into line (a). However, it is also ensured that rectifier circuit (10) represents a negligible load for the closing voltage and the high-frequency supply voltage.

Capacitance (C2) advantageously has values between 1 microfarad (1 μF) and 10 microfarads (10 μF).

As regards dimensioning of the capacitor, the following factors must be considered:
  a) The charging operation must be possible rapidly (for example, within 50 milliseconds (ms)).
  b) A sufficiently high blocking voltage must be available for a sufficiently long duration (for example, one second (1 s)). The discharge time constant is determined by capacitor (C2) and resistors (R3, R4).

With the specified times, it is possible, for example, to operate an antenna array of an RFID system with eight antennas, which are disposed relatively close to one another and are driven by a multiplexer, but between each of which unwanted coupling exists to some extent.

The dimensioning of capacitor (C2) and resistors (R3, R4) therefore depends strongly on how high a certain value of the blocking voltage must be and on how long it must be available. However, the value of the needed blocking voltage depends on the coupling between an antenna turned off via switch (14) and a neighboring active antenna, and is therefore extremely dependent on the respective application of the switch.

Figure 3:
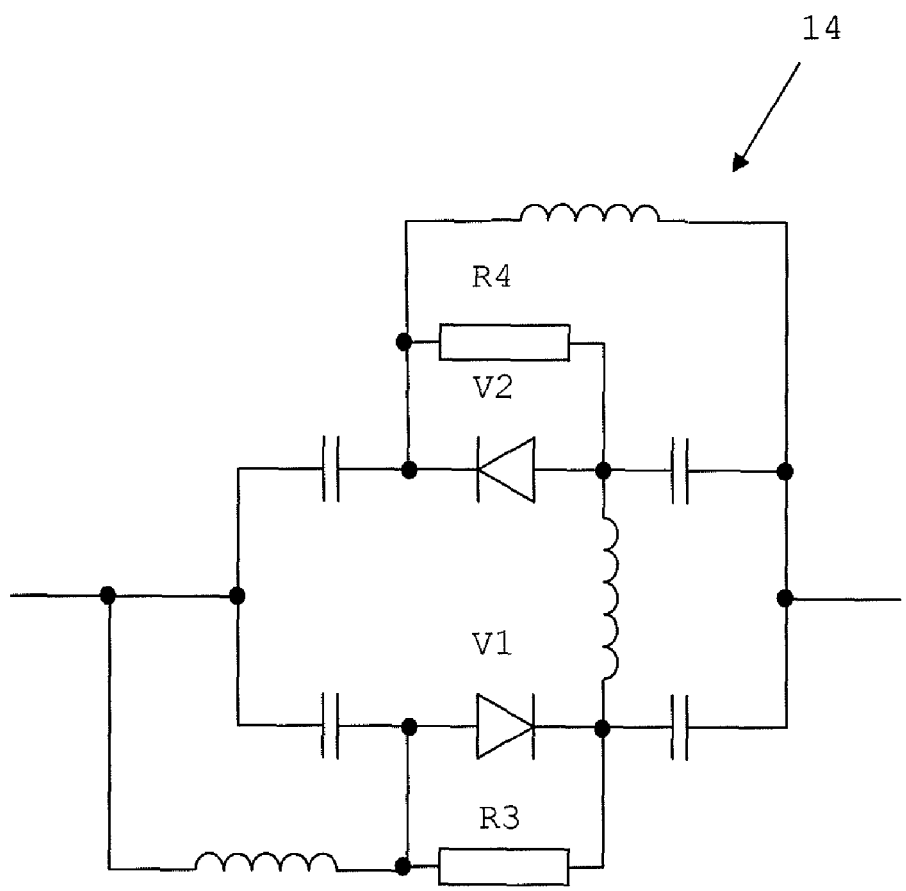
FIG. 3 shows a circuit diagram of the high-frequency switch with additional resistors.

FIG. 3 shows the structure of high-frequency switch (14) with two PIN diodes (V1, V2). In this case, high-impedance resistors (R3, R4) of equal value are connected in parallel with respective PIN diodes (V1, V2), which are series-connected with respect to direct current. Thereby the blocking voltage is divided equally between the two PIN diodes (V1, V2), so that both can be blocked.

According to an advantageous embodiment of the invention, resistor (R3, R4) is designed as a high-impedance resistor. The values of resistor (R3, R4) are advantageously between 1 megaohm (1 MΩ) and 10 megaohm (10 MΩ). These resistance values, which are one thousand times higher than that of resistor (R1), are necessary in practice, to ensure that the charge stored in buffer capacitor (C2) can flow away only slowly via resistors (R3 and R4), thus allowing rectifier circuit (10) to hold switch (14) open for the longest possible time. A further reason for the resistance ratio (R1 to R3 and R4) is substantiated by the fact that resistors (R1, R3 and R4) represent a series circuit with respect to direct current and that the largest possible fraction of the of the drop of blocking voltage should take place across resistors (R3 and R4).

Figure 4:
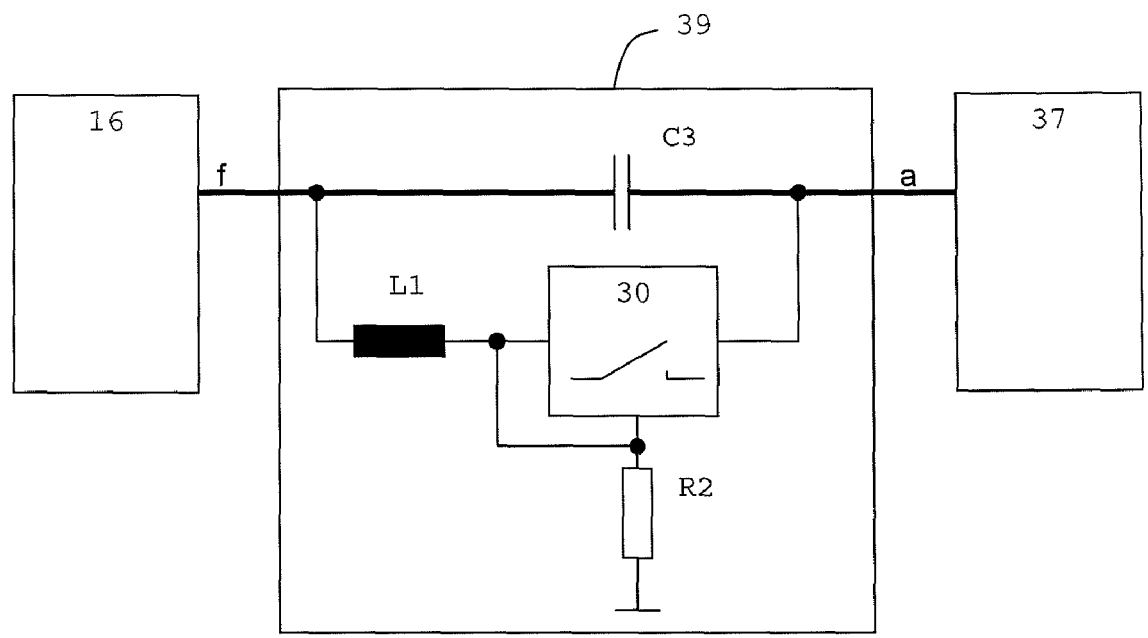
FIG. 4 shows a block diagram with decoupling circuit.

FIG. 4 shows a block diagram of an embodiment of the invention in which feedback of the blocking voltage to write/read station (16), which is illustrated as an example, is prevented by use of a decoupling circuit (39), albeit while permitting the closing voltage to be conducted from write/read station (16) to an antenna board (37) via the same line (a, f) via which the high-frequency voltage supplying the antenna is also conducted. At the same time, the circuit ensures that the connection, with respect to direct current, between write/read station (16) and antenna board (37) is automatically disconnected as soon as closing voltage from write/read station (16) is no longer present. In this case antenna board (37) contains rectifier circuit (10), matching circuit (13), high-frequency switch (14) and resonance circuit (15) as components.

In this exemplary embodiment, decoupling circuit (39) comprises a switch (30), which can be designed as a transistor switch or optocoupler, for example, a capacitor (C3), an inductor (choke) (L1) and a resistor (R1). If a closing voltage is present via connecting line (f), switch (30) is closed, and so the d.c. voltage can reach connecting line (a). If the closing voltage is turned off, switch (30) opens the connection with respect to direct current, and the high blocking voltage present at decoupling circuit (39) via connecting line (a) is disconnected from the rest of the apparatus. Capacitor (C3) represents the connection with respect to high-frequency voltage, while inductor (L1) ensures that the high-frequency voltage is not loaded via resistor (R2). Resistor (R2) has such high impedance that it also loads the closing voltage to the smallest extent possible.

REFERENCE SYMBOLS

| 10 | Rectifier circuit |
| 12 | Means for generating a closing voltage |
| 13 | Matching circuit |
| 14 | High-frequency switch |
| 15 | Resonance circuit |
| 16 | Write/read station |
| 25 | Filter circuit |
| 26 | Rectifier |
| 30 | Switch |
| 37 | Antenna board |

-continued

| 39 | Decoupling circuit |
| a | Connecting line |
| b | Connecting line |
| c | Connecting line |
| d | Connecting line |
| e | Connecting line |
| f | Connecting line |
| C1 | Capacitor |
| C2 | Capacitor |
| C3 | Capacitor |
| R1 | Resistor |
| R2 | Resistor |
| R3 | Resistor |
| R4 | Resistor |
| L1 | Choke |
| V1 | PIN diode |
| V1 | PIN diode |

What is claimed:

1. An electronic circuit for a high-frequency switch for opening an antenna resonance circuit of an RFID system, wherein the high-frequency switch, which is composed of at least two PIN diodes, can be opened and closed by d.c. voltages, comprises:

a rectifier circuit, which is disposed outside the antenna resonance circuit, generates the blocking voltage for opening the high-frequency switch from the high-frequency supply voltage, the tapping operation, which takes place via at least one connecting line (b), being decoupled with respect to direct current from the rectifier circuit, and the rectifier circuit is designed such that it generates a blocking voltage whose value corresponds at least to the peak-to-peak value of the high-frequency voltage to be switched, and the blocking voltage is conducted via the same electric connecting line (a) via which the high-frequency supply voltage and a closing voltage are also conducted to the antenna of the RFID system, injection of the blocking voltage taking place with an high impedance, and resistors are connected in parallel with the respective PIN diodes which are series-connected with respect to direct current.

2. An electronic circuit according to claim 1, characterized in that the rectifier circuit for generating the blocking voltage is a one-way rectifier circuit.

3. An electronic circuit according to claim 1, characterized in that the rectifier circuit for generating the blocking voltage is a voltage-multiplying circuit.

4. An electronic circuit according to claim 1, characterized in that there is provided a capacitor for maintaining the blocking voltage at least for the necessary duration.

5. An electronic circuit according to one of the preceding claims, characterized in that there is provided a decoupling circuit, which is designed as a decoupling circuit that prevents discharge of the blocking voltage via the connecting line (a, f).

6. An electronic circuit according to claim 1, characterized in that the resistors have values between 1 megaohm and 10 megaohm.

7. An electronic circuit according to claim 4, characterized in that the capacitor has values between 1 microfarad and 10 microfarads.

* * * * *